(12) United States Patent
Hanke

(10) Patent No.: US 9,795,045 B2
(45) Date of Patent: Oct. 17, 2017

(54) UNDERWATER SWITCH UNIT

(71) Applicant: OASE GmbH, Hörstel-Riesenbeck (DE)

(72) Inventor: Andreas Hanke, Osnabrück (DE)

(73) Assignee: OASE GmbH, Hörstel-Riesenbeck (DE)

( * ) Notice: Subject to any disclaimer, the term of this patent is extended or adjusted under 35 U.S.C. 154(b) by 0 days.

(21) Appl. No.: 14/783,454

(22) PCT Filed: Apr. 9, 2014

(86) PCT No.: PCT/EP2014/000948
§ 371 (c)(1),
(2) Date: Oct. 9, 2015

(87) PCT Pub. No.: WO2014/166629
PCT Pub. Date: Oct. 16, 2014

(65) Prior Publication Data
US 2016/0057880 A1  Feb. 25, 2016

(30) Foreign Application Priority Data

Apr. 9, 2013  (DE) .......................... 10 2013 005 973

(51) Int. Cl.
*H02B 1/20* (2006.01)
*H05K 5/06* (2006.01)
(Continued)

(52) U.S. Cl.
CPC ............. *H05K 5/064* (2013.01); *A01K 63/06* (2013.01); *H05B 33/0803* (2013.01);
(Continued)

(58) Field of Classification Search
CPC .......... H02B 1/202; B60Q 1/38; H05K 7/142; G06F 1/184
(Continued)

(56) References Cited

U.S. PATENT DOCUMENTS 4,096,466 A * 6/1978 Johnson ................. H04B 11/00
  200/61.05
5,211,469 A   5/1993 Matthias et al.
(Continued)

FOREIGN PATENT DOCUMENTS

EP     0 418 431 A1    3/2001
JP     2004286860 A    10/2004
(Continued)

*Primary Examiner* — Hung S Bui
(74) *Attorney, Agent, or Firm* — Gudrun E. Huckett

(57) ABSTRACT

The invention relates to an underwater switch unit for voltage supply of electrical devices (11), particularly in the low voltage range, having a housing (19) which is preferably designed to be water-tight, in which an electronics unit (2) is arranged, by means of which an input voltage, which can be connected via an input connection of the underwater switch unit (14), can be distributed in parallel to a plurality of output connections (16) of the underwater switch unit (14), wherein at least two of the output connections (16) can be supplied with voltage separate from each other via at least one switch element (7, 8) of the underwater switch unit (14), and wherein the uncontrolled underwater switch unit (14) comprises a data bus connection having a related data bus interface, via which an informational signal concerning the voltage connection of an output connection (16) can be detected.

16 Claims, 5 Drawing Sheets

(51) Int. Cl.
  *A01K 63/06* (2006.01)
  *H05K 5/00* (2006.01)
  H05B 33/08 (2006.01)
  H05B 37/02 (2006.01)
(52) U.S. Cl.
  CPC ....... *H05K 5/0026* (2013.01); *H05B 33/0842* (2013.01); *H05B 37/029* (2013.01)
(58) Field of Classification Search
  USPC .......................................... 361/728–732, 828
  See application file for complete search history.

(56) References Cited

U.S. PATENT DOCUMENTS

| | | | |
|---|---|---|---|
| 6,624,990 B1* | 9/2003 | Lortscher | H01H 9/04 361/42 |
| 2004/0182765 A1 | 9/2004 | Mauro, Sr. et al. | |
| 2005/0248944 A1 | 11/2005 | Sloan | |
| 2006/0023454 A1 | 2/2006 | Koren | |
| 2008/0197788 A1* | 8/2008 | Conover | H05B 37/029 315/291 |
| 2011/0247825 A1 | 10/2011 | Batho et al. | |
| 2015/0362166 A1* | 12/2015 | Hanke | F21V 29/004 362/231 |

FOREIGN PATENT DOCUMENTS

| | | |
|---|---|---|
| WO | 2008/067402 A2 | 6/2008 |
| WO | 2008/149236 A2 | 12/2008 |
| WO | 2012/038237 | 3/2012 |
| WO | 2013/156146 A1 | 10/2013 |

* cited by examiner

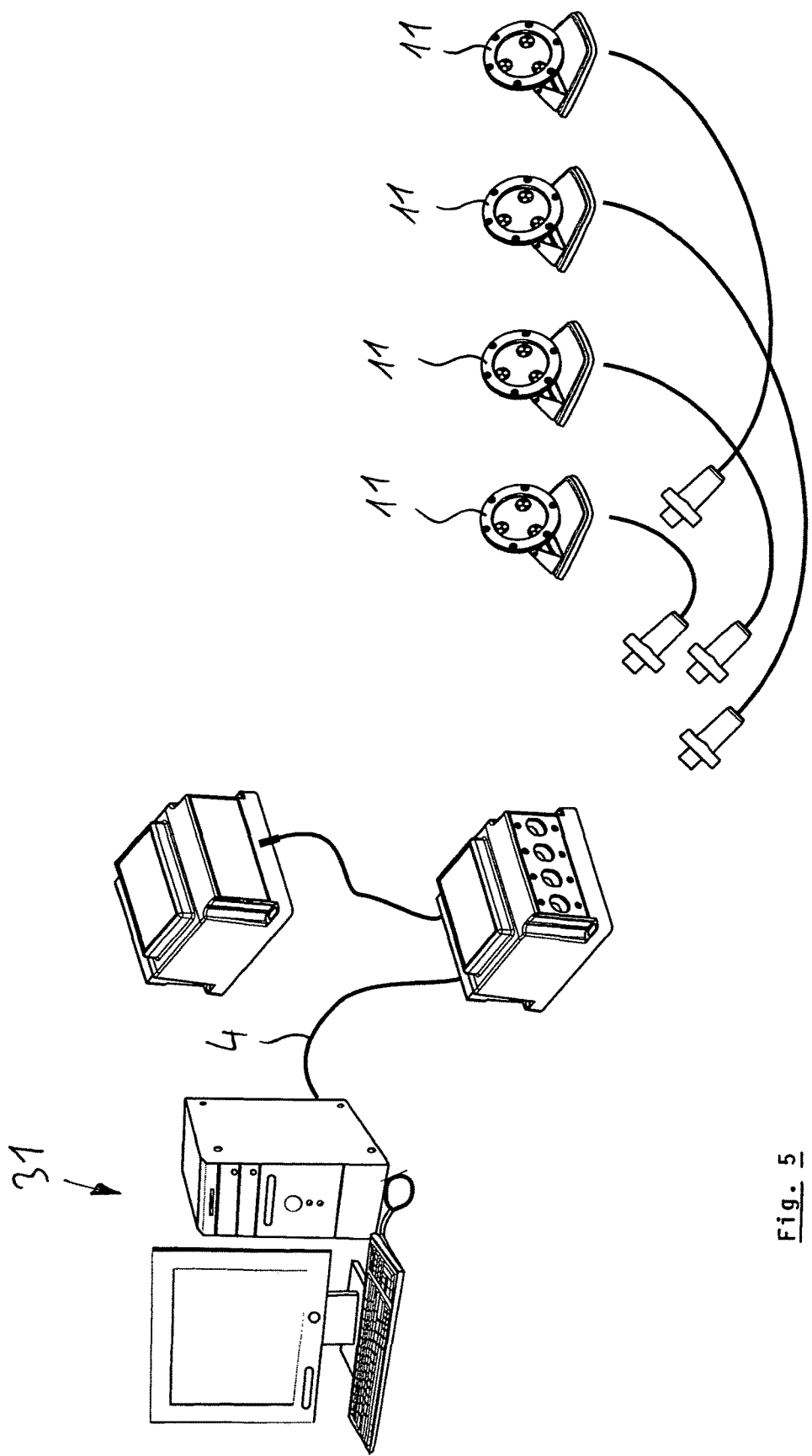

UNDERWATER SWITCH UNIT

BACKGROUND OF THE INVENTION

The present invention concerns an underwater switch unit for voltage supply of electric devices, in particular in the low voltage range up to 30 volts, preferably for 12 volt or 24 volt systems. These may be direct current or alternating current systems.

For switching electric devices such as lights, pumps, or switch valves, it is standard practice in the field of pond and aquarium technology to use switch units in the form of electrical cabinets outside of the water. For supply of each individual terminal device, cables are then laid that must be appropriately long. This results in high costs for electric power and cables as well as increased costs for installation.

It is the objective of the present invention to minimize material use and current consumption for the supply of electric devices that are to be arranged in particular in or also at the water.

SUMMARY OF THE INVENTION

The objective is solved by an underwater switch unit for voltage supply of electric devices, in particular in the low voltage range, comprising a housing which is preferably embodied to be watertight, in which an electronic unit is arranged with which an input voltage, which can be applied by an input connector of the underwater switch unit, can be distributed in parallel onto several output connectors of the underwater switch unit, wherein at least two of the output connectors can be supplied separate from each other with voltage by means of at least one switch element of the underwater switch unit, and wherein the underwater switch unit, which is incapable of a controlling action, comprises a data bus connector with an associated data bus interface by means of which an information signal concerning the voltage supply of an output connector is detectable. Advantageous embodiments of the invention can be taken from the dependent claims as well as the following description.

According to the invention, it is provided that the underwater switch unit is provided with a housing which is in particular designed to be watertight and in which an electronic unit is arranged. By means of the electronic unit, an input voltage, that can be supplied by an input connector of the underwater switch unit, can be distributed in parallel to several output connectors of the underwater switch unit, wherein at least two of the output connectors can be loaded separate from each other with voltage by means of at least one switch element of the underwater switch unit, and wherein the underwater switch unit that is incapable of a controlling action comprises a data bus connector with associated data bus interface with which an information signal concerning the voltage supply of an output connector can be detected.

The term incapable of a controlling action is to be understood in this context as an underwater switch unit that cannot perform processing and transmission of control signals for dimming, color change or frequency control of connected electric devices. The functionality of the underwater switch unit according to the invention is simple. The unit is correspondingly of an inexpensive design in that only the voltage applied by an input connector, in particular a 12 volt or 24 volt direct voltage, is supplied in parallel to the outputs and can be separately switched on. At most, the underwater switch unit is capable of status inquiry such as, for example, current flow across the connectors, switching state of the connectors, voltage at the individual connectors as well as at possible components, and optionally transmitting a temperature information. Accordingly, it is a pure switch unit that is provided without controller function for the electric devices in the field of pond and aquarium technology in regard to operating these devices. Preferably, the electric devices are terminal devices such as, for example, LED lights or pumps. However, they may also be, for example, solenoid valves.

For control of the at least one switch element, the underwater switch unit (in the following also "switch unit") is provided with a data bus connector in the form of a data bus interface which is connected with the data bus connector, by means of which, for example, signals of a DMX bus or DMX RDM bus can be processed.

Systems such as pumps, lights or switch valves to be arranged in the water can then be supplied with power via short cable lengths by means of the central switch unit that is to be arranged, for example, in the water. Only a longer conduit to the underwater switch unit itself as well as a longer conduit for the data cable by means of which the bus signal is transmitted are required. For example, when arranging four devices in the form of underwater lights, which otherwise would have to be supplied separately from an electrical cabinet, the conduit lengths can thus be approximately cut in half.

This provides cost savings in regard to material and current consumption and reduces the installation expenditure.

Via the data bus, signal information can be supplied to the switch unit by means of which the electric devices or terminal devices supplied by the underwater switch unit can be switched on or off separately, in pairs, or in groups.

Preferably, each output connector has associated therewith a switch element so that, despite the still great simplicity of the circuitry, a satisfactory flexibility in the meaning of different connecting patterns to respective groups of terminal devices is possible.

Preferably, the underwater switch unit is provided with at least four output connectors by means of which correspondingly four terminal devices can be supplied. In this context, the underwater connectors are embodied for watertight connection of a plug contact which is to be provided on the electric device.

Alternatively or in addition, the underwater switch unit can be provided with at least one distributor connectable to an output connector and by means of which several terminal devices can be connected to an output. In this way, a very high number of terminal devices can be switched simultaneously, limited by the permissible current strengths in the device.

The switch element is designed for a switching frequency of at least 100 Hz so that, for example, an underwater light display with a plurality of differently colored terminal devices, for example, LED light modules, can still generate complex effects.

In a further embodiment of the underwater switch unit according to the invention, it is provided with at least two switch elements wherein the switch elements each are electronic switch elements. The latter are in particular embodied as transistor, here in particular as MOSFET, or as thyristor or triac and can switch then correspondingly direct current (transistor) or alternating current (thyristor/triac). Preferably, 12 volt or 24 volt direct current systems and appropriate switch elements such as, for example, power MOSFETs, are provided.

The electronic unit of the underwater unit is thus embodied in regard to the electric devices only for switching on and switching off. The underwater switch unit comprises additional functionality only in regard to the interface unit as well as optionally in regard to the afore described status inquiry.

Alternatively, the switch elements can also be designed as relays wherein this concerns an underwater switch unit that is particularly easy to install.

Preferably, the housing is embodied so as to be potted watertightly. Watertight means in this context fulfillment of the standard according to IP 68.

Alternatively or in addition, the electronic unit with the data bus interface and the switch element is arranged in a watertight potting compound in particular on a single printed circuit board so that an additional or supplemental protection is affected. By furnishing a single printed circuit board with the respective components, the manufacture of the underwater switch unit according to the invention is simplified.

For protecting the switch elements which are in particular electronic, each output connector has connected thereto a flyback diode so that, for example, when switching off solenoid valves, resulting voltage spikes can be removed without being critical for the switch element.

An increase of the operational safety is furthermore provided when the data bus interface is separated galvanically from the operating voltage potential or the corresponding circuit.

In this context, the data bus interface can still be part of the electronic unit which is present for controlling the switch elements. However, it can also be a separate unit.

For controlling any terminal devices that are to be connected to the underwater switch unit, it is advantageous when the underwater switch unit comprises at least one control unit in the form of a pre-programmed or programmable control that is connectable by means of the data bus connector to the electronic unit and is installable separate from the housing. In this context, this can be, for example, a remote control that is connected wireless to a control element (sender receiver element) by means of which the individual functions of the underwater switch unit can be activated or queried. Also, this may be a computer program control that can be realized by means of a PC, tablet PC, smartphone or similar electronic data processing devices.

Further advantages and details of the invention can be taken from the following figure description.

BRIEF DESCRIPTION OF THE DRAWINGS

In the following schematically illustrated drawings it is shown in:

FIG. 5 the object according to FIG. 4 in a further embodiment.

Same or similarly acting parts, inasmuch as this is beneficial, are provided with identical reference numbers. Individual technical features of the embodiments disclosed in the following, together with the features of the independent claim as well as supplemented with features of the afore described embodiments, can lead to further embodiments according to the invention.

DESCRIPTION OF PREFERRED EMBODIMENTS

Figure 1:
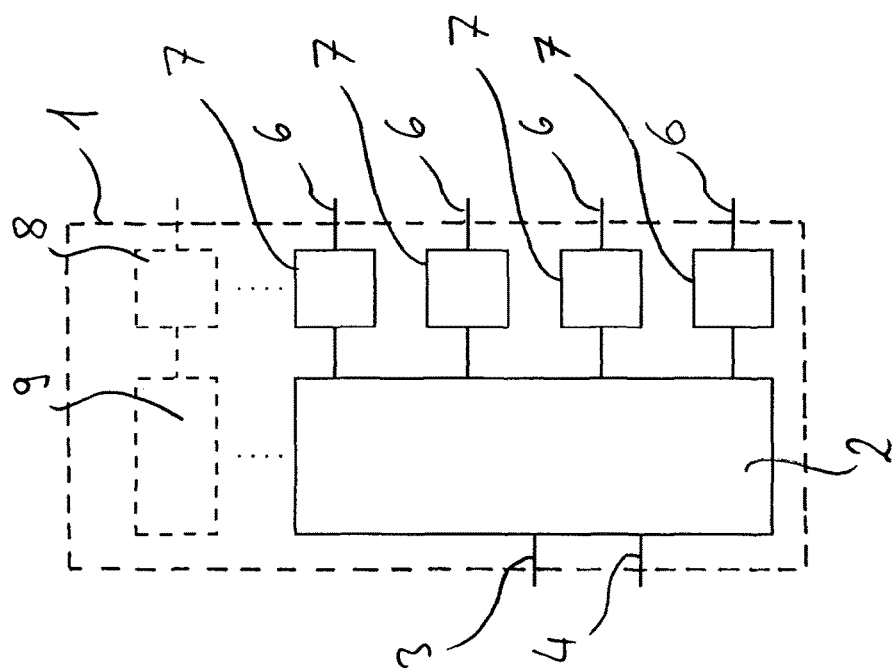
FIG. 1 a schematic illustration of the object of the present invention.

In the block diagram of FIG. 1, the elements of an underwater switch unit according to the invention are surrounded by a dashed line 1. The underwater switch unit in the present case is provided for voltage supply of underwater lights that can also be arranged below the water surface in a pond. Accordingly, the line 1 indicates a housing which is embodied watertight according to standard IP 68 and in which an electronic unit 2 is arranged. The electronic unit 2 is supplied by a conduit 3 with input voltage, in particular 24 volt direct current. By means of a data bus conduit 4 the transmission of an information signal concerning the voltage supply of one or several of the output connectors is realized.

The output connectors are illustrated by four solid line conduits 6 which cross the dashed line 1.

By means of the electronic unit 2 which comprises a data bus interface, not shown in detail, an input voltage that can be supplied by an input connector can be distributed in parallel to output connectors of the underwater switch unit. Each one of the output connectors has correlated therewith a switch element in the form of a power MOSFET (7). In dashed lines, an expansion stage of the underwater switch unit according to the invention is illustrated with a further switch element 8 and an associated part 9 of the electronic unit. For example, the electronic unit can comprise connectors for four additional outputs so that a total of eight devices can be supplied separately with the input voltage by means of the same underwater switch unit.

By means of the data bus line 4, information in regard to the current flowing through the output conduits 6, the switching state of the switch elements 7 and 8, the applied voltage thereat, as well as the temperature of the electronic unit can be supplied from the underwater switch unit to a control unit. A control of the terminal devices connected to the connectors beyond supplying or switching off the voltage cannot be realized by means of the present underwater switch unit. The advantages of the underwater switch unit according to the invention are to be viewed in particular in the simplicity of its configuration.

In control operation, the employed transistors, in the present case power MOSFETs, can conduct a current of 2.5 A. It serves, for example, for operation of LED or halogen underwater lights. When switching off, for example, inductive loads such as solenoid valves, current spikes of up to 13 A can be absorbed by the switch element; alternatively, the latter as well as the electronic unit 2 can be protected by a flyback diode.

Should accidentally voltage sources be connected at the output, which may happen in case of system plugs of identical configuration for the input side as well as for the output side, each output can have associated therewith a protective diode which is designed for voltage sources up to 16 A.

Figure 2:
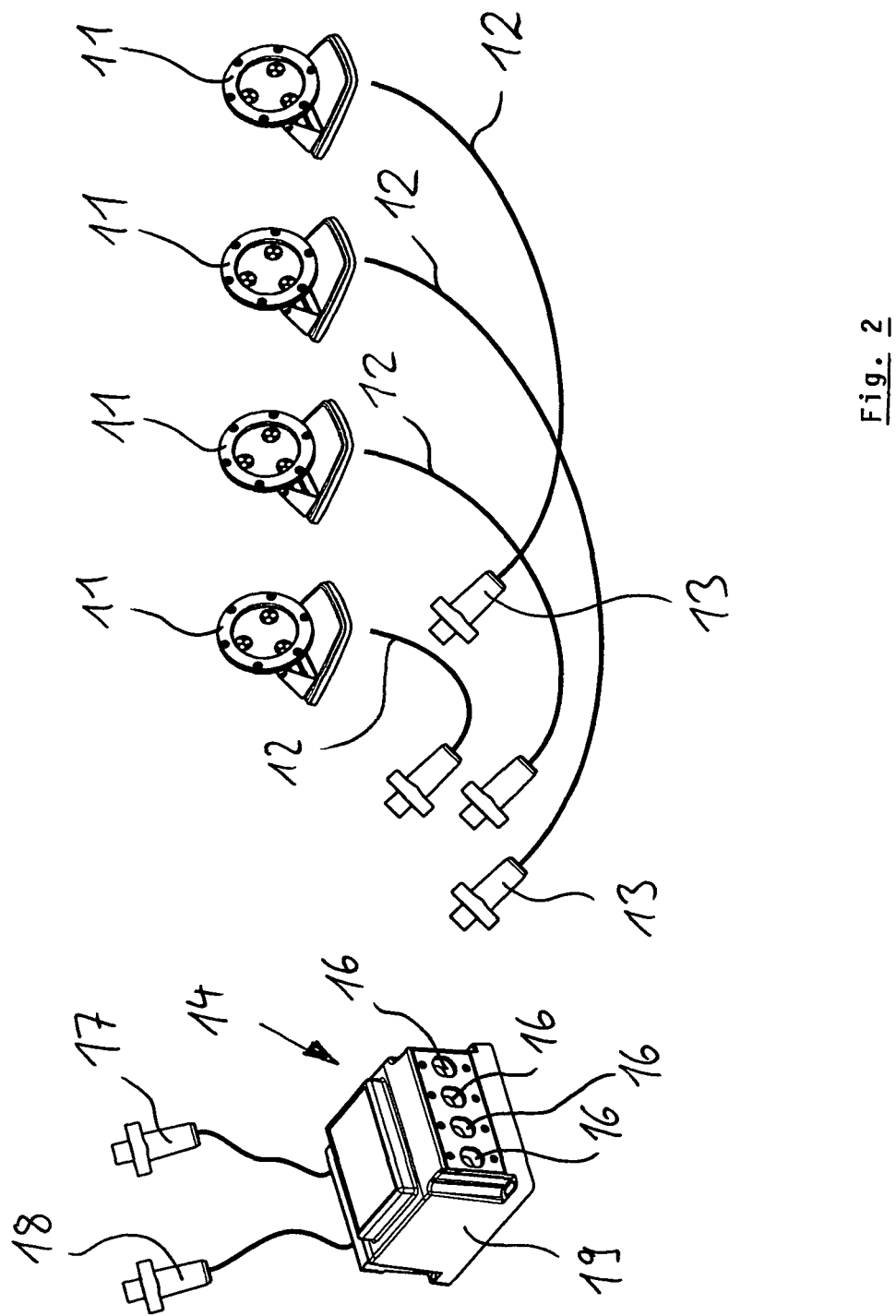
FIG. 2 the object of FIG. 1 with terminal devices to be connected.

Corresponding system plugs with connectors to be provided at the underwater switch unit are illustrated in FIG. 2. Light modules 11 are provided here as terminal devices to be supplied which by means of connecting conduits 12 which are provided at the ends with system plugs 13 are connectable to the underwater switch unit 14. For this purpose, the system plugs 13 are connectable watertightly with output connectors 16.

At the input side there are also system plugs 17 for the voltage supply and 18 for the data bus cable.

The entire housing 19 is designed to be watertight. Internally, the electronic unit 2 is provided with a printed circuit board on which the respective components such as bus interface, switch elements 7 as well as optionally an EEPROM unit for the firmware of the device are potted watertightly.

Figure 3:
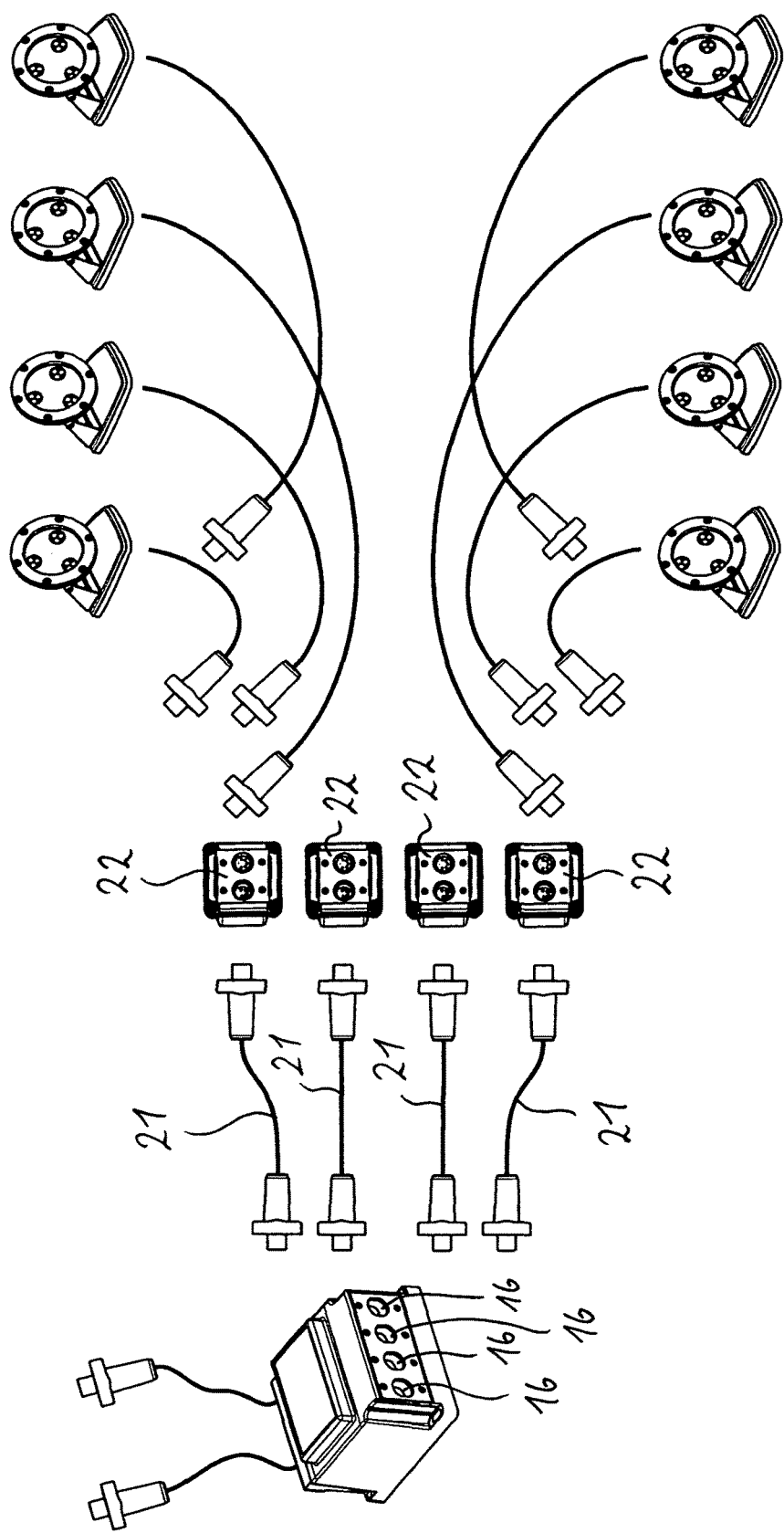
FIG. 3 a further object according to the invention with a greater number of terminal devices in comparison to FIG. 2.

The embodiment according to FIG. 3 comprises in addition to the already described components of FIG. 2 additional connecting cables 21 provided with system plugs by means of which distributors 22 that are respectively connectable to an output connector 16 can be supplied with current.

Each distributor 22 has correlated therewith a plurality of terminal devices (in the present case two) in the form of light modules so that by means of the four outputs a total of eight light modules in the form of four groups of two modules each can be operated.

Figure 4:
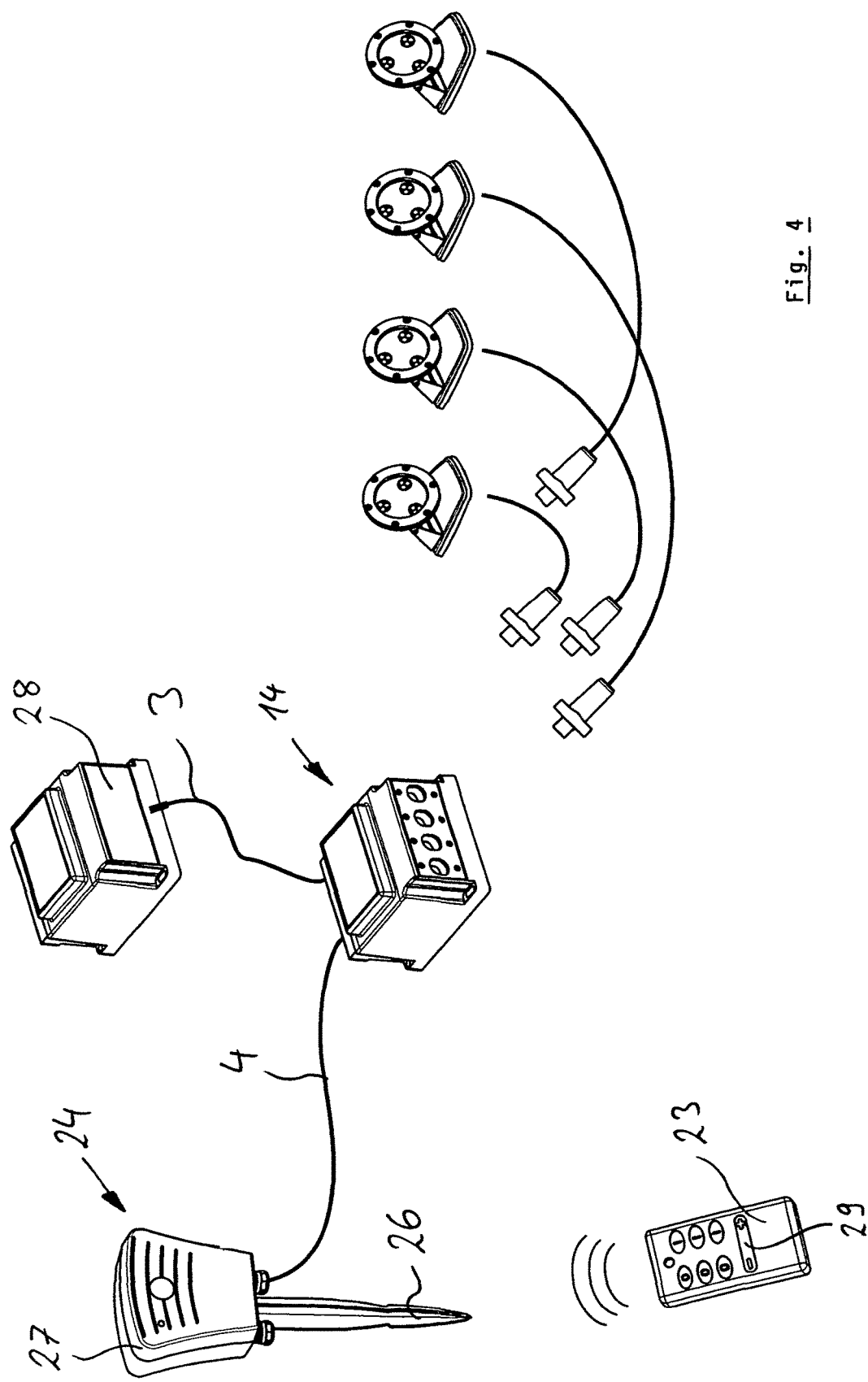
FIG. 4 a further object according to the invention.

A further embodiment (FIG. 4) is provided with a pre-programmed control unit which is embodied in the form of a remote control 23, which can conduct signals wireless to a signal receiver 24, and the signal receiver, which is connected in turn with a data cable to the underwater switch unit 14. The receiving unit 24 is fastenable by means of a spike-like fastening element 26 in the soil near a pond. Its housing 27 can be opened and can be provided with a battery or a rechargeable battery. Alternatively or in addition, photovoltaic elements can be integrated into the housing surface in order to ensure a long-term current supply of the receiving unit 24.

A transformer 28 is arranged at the input connector by means of a conduit 3 and is also designed to be watertight, but can also be arranged outside of the water.

In the present case, the four light modules which are divided into three groups can be switched on and off by means of the control unit (operating elements "0" and "1"). By means of a switch 29 individual light modules can be switched on additionally or switched off. Instead of such a predetermined or pre-programmed control, an electronic data processing unit 31 can also be connected via the data cable 4 and with it the light modules 11 or other terminal devices, which are arranged on the underwater switching unit according to the invention, can be switched on and off in a freely programmable fashion (FIG. 5).

What is claimed is:

1. An underwater switch unit for voltage supply of electric devices, the underwater switch unit comprising:
    a watertight housing comprising output connectors and an input connector;
    an electronic unit arranged inside the watertight housing, wherein an input voltage is applied through the input connector to the electronic unit, wherein the electronic unit is configured to distribute the input voltage in parallel onto the output connectors;
    at least one switch element arranged inside the watertight housing and operatively connected to one or more of the output connectors such that at least two of the output connectors are supplied separately with input voltage;
    wherein the underwater switch unit is incapable of a controlling action on electric devices to be connected to the output connectors;
    a data bus connector with an associated data bus interface configured to detect an information signal concerning a voltage supply of one of the output connectors.

2. The underwater switch unit according to claim 1, wherein the output connectors each have one of the switch elements operatively connected thereto.

3. The underwater switch unit according to claim 1, wherein the switch element is designed for a switching frequency of at least 100 Hz.

4. The underwater switch unit according to claim 1, wherein the switch element is an electronic switch element.

5. The underwater switch unit according to claim 4, wherein the electronic switch element is selected from the group consisting of a transistor, a thyristor, and a triac.

6. The underwater switch unit according to claim 1, comprising at least two of the switch elements that are in the form of a relay.

7. The underwater switch unit according to claim 1, wherein the electronic unit, the data bus interface, and the switch element are arranged in a watertight potting compound.

8. The underwater switch unit according to claim 7, further comprising a printed circuit board, wherein the electronic unit, the data bus interface, and the switch element are arranged on the printed circuit board.

9. The underwater switch unit according to claim 1, wherein the housing is watertightly potted.

10. The underwater switch unit according to claim 1, wherein the output connectors each have a flyback diode connected thereto.

11. The underwater switch unit according to claim 1, wherein the data bus interface is separated galvanically from an operating voltage potential of the underwater switch unit.

12. The underwater switch unit according to claim 1, further comprising at least one distributor connected to one of the output connectors, wherein the at least one distributor is configured to connect several electric devices to said one output connector.

13. The underwater switch unit according to claim 1, further comprising at least one control unit connected by the data bus connector to the electronic unit, wherein the at least one control unit is configured to be installed separate from the housing and is configured to provide pre-programmed control or programmable control of electric devices to be connected to the output connectors.

14. The underwater switch unit according to claim 1, wherein the underwater switch unit is incapable of processing and transmitting control signals for dimming, color changes or frequency control of electric devices to be connected to the output connectors.

15. The underwater switch unit according to claim 1, wherein the underwater switch unit is without a controller function for operating electric devices to be connected to the output connectors.

16. The underwater switch unit according to claim 1, wherein the underwater switch unit is incapable of a controlling action beyond supplying or switching off the voltage to electric devices to be connected to the output connectors.

* * * * *